(12) United States Patent
Takiba et al.

(10) Patent No.: US 8,847,660 B2
(45) Date of Patent: Sep. 30, 2014

(54) LEVEL SHIFT SWITCH AND ELECTRONIC DEVICE WITH THE SAME

(71) Applicant: Kabushiki Kaisha Toshiba, Tokyo (JP)

(72) Inventors: Akira Takiba, Kanagawa-ken (JP); Chikahiro Hori, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/941,933

(22) Filed: Jul. 15, 2013

(65) Prior Publication Data

US 2014/0118049 A1    May 1, 2014

(51) Int. Cl.
*H03L 5/00*    (2006.01)
(52) U.S. Cl.
CPC ............................. *H03L 5/00* (2013.01)
USPC .......................................................... 327/333

(58) Field of Classification Search
USPC .......................................................... 327/333
See application file for complete search history.

(56) References Cited

U.S. PATENT DOCUMENTS

| | | | |
|---|---|---|---|
| 2008/0164932 A1* | 7/2008 | Welty | 327/333 |
| 2010/0214860 A1* | 8/2010 | Upputuri | 365/206 |
| 2011/0133562 A1 | 6/2011 | Koashi | |
| 2011/0227626 A1* | 9/2011 | Sakurai et al. | 327/333 |
| 2013/0002332 A1 | 1/2013 | Takiba | |

* cited by examiner

*Primary Examiner* — Daniel Rojas
(74) *Attorney, Agent, or Firm* — White & Case LLP

(57) ABSTRACT

According to one embodiment, in a level shift switch, a first input signal is inputted into a first input-output terminal, a first output signal is outputted from a second input-output terminal, a second input signal is inputted into the second input-output terminal, a second output signal is outputted from the first input-output terminal. The level shift switch includes a transmission circuit, a first MOSFET, a second MOSFET, and a first one-shot pulse generation circuit.

17 Claims, 17 Drawing Sheets

Sin1⇒Sout1

| Ssg11 | N1 | NMT1 | NMT11 | NMT12 | N16 | PMT1/PMT2 | N2 | TIME PERIOD |
|---|---|---|---|---|---|---|---|---|
| "H" | "L" | OFF | OFF | OFF | "H" | OFF | "L" | TIME PERIOD 1 |
| "H" | "L⇒H" | OFF⇒ON | OFF | OFF | "H" | OFF | "L"↗ | |
| "H" | Vcca/2 | ON | OFF | OFF | "H" | OFF | "L"↗ | Tsd |
| "H" | ↗"H" | ON | OFF | OFF | "H" | OFF | Vcca-VthN | TIME PERIOD 1A |
| "H" | "H" (Vcca) | ON | OFF⇒ON | OFF⇒ON | "H⇒L" | OFF⇒ON | Vcca-VthN | |
| "H" | "H" (Vcca) | ON | ON | ON | "L" | ON | Vccb/2 | TIME PERIOD 2 |
| "H" | "H" (Vcca) | ON | ON⇒OFF | ON⇒OFF | "L⇒H" | ON⇒OFF | "H" (Vccb) | |
| "H" | "H" (Vcca) | ON | OFF | OFF | "H" | OFF | "H" (Vccb) | TIME PERIOD 3 |

FIG. 5

Sin1 ⇒ Sout1

| Ssg11 | N1 | NMT1 | N29 | PMT1/PMT2 | N2 | TIME |
|---|---|---|---|---|---|---|
| "H" | "L" | OFF | "H" | OFF | "L" | TIME PERIOD 11 |
| "H" | "L⇒H" | OFF⇒ON | "H" | OFF | "L" ↗ | TIME PERIOD 11 |
| "H" | Vcca/2 | ON | "H" | OFF | "L" ↗ | TIME PERIOD 11A |
| "H" | ↗ "H" | ON | "H" | OFF | Vcca-VthN | TIME PERIOD 11A |
| "H" | "H" (Vcca) | ON | "H⇒L" | OFF⇒ON | Vcca-VthN | Tsd11 |
| "H" | "H" (Vcca) | ON | "L" | ON | Vccb/2 | TIME PERIOD 12 |
| "H" | "H" (Vcca) | ON | "L⇒H" | ON⇒OFF | "H" (Vccb) | |
| "H" | "H" (Vcca) | ON | "H" | OFF | "H" (Vccb) | TIME PERIOD 13 |

FIG. 7

LEVEL SHIFT SWITCH AND ELECTRONIC DEVICE WITH THE SAME

CROSS REFERENCE TO RELATED APPLICATION

This application is based upon and claims the benefit of priority from the prior Japanese Patent Application No. 2012-238631, filed on Oct. 30, 2012, the entire contents of which are incorporated herein by reference.

FIELD

Embodiments described herein relate to a level shift switch and an electronic device including the level shift switch.

BACKGROUND

Electronic devices include semiconductor integrated circuits (LSI) with a logic circuit or a sequential circuit, which are composed of CMOS (Complementary Metal Oxide Semiconductor), or the like, and a power supply system with different power supply voltages. The electronic devices are provided with a level shifter for shifting signal levels between different power supplies. The level shifter has two types. One of the two types is simplex, and the other of the two types is duplex.

Recently, a plurality of level shift switches is used for consumer and industrial electronic devices, which have high functionality, high speed, and multiple power supplies. Duplex level shifters are required to have fast operation without a directional switching signal (DIR control signal). The duplex level shifters include level-shift switches based on semiconductor switch circuitry. The level-shift switches are strongly required to have high speed.

BRIEF DESCRIPTION OF THE DRAWINGS

FIG. 5 is a diagram describing an operation of the level shift switch according to the first embodiment;

FIG. 7 is a diagram describing an operation of a level shift switch of a comparative example according to the first embodiment;

DETAILED DESCRIPTION

Figure 1:
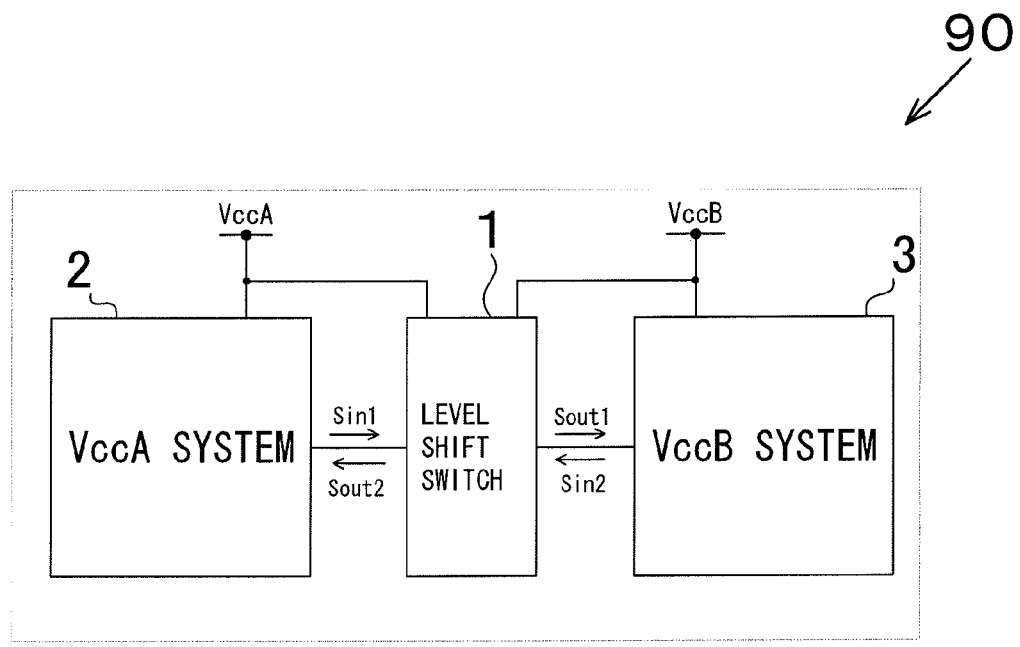
FIG. 1 is a schematic configuration diagram showing an electronic device according to a first embodiment.

According to one embodiment, a level shift switch includes a transmission circuit, a second transistor, a third transistor, and a first one-shot pulse generation circuit. The transmission circuit includes a first transistor, the transmission circuit transmits a signal between a first input-output terminal and a second input-output terminal, one end of the first transistor is connected to the first input-output terminal, the other end of the first transistor is connected to the second input-output terminal. The second transistor has one end connected to a first power supply and the other end connected to the first input-output terminal. The third transistor has one end connected to a second power supply and the other end connected to the second input-output terminal. The first one-shot pulse generation circuit includes a fourth transistor and a fifth transistor, the first one-shot pulse generation circuit is provided between the first input-output terminal and the second input-output terminal, the first one-shot pulse generation circuit outputs a one-shot pulse signal to the second transistor and the third transistor, a first signal is inputted into the fourth transistor not through a delay circuit but through the first input-output terminal, a second signal is inputted into the fifth transistor, the second signal is generated by delaying and inverting the first signal, the fifth transistor has one end to output a first one-shot pulse signal and the other end connected to the fourth transistor.

According to another embodiment, an electronic device includes a first circuit, a second circuit, and a level shift switch. The first circuit performs signal processing when the first circuit is supplied with a first power supply. The second circuit performs signal processing when the second circuit is supplied with a second power supply having a voltage equal to or higher than a first power supply voltage. The level shift switch has a first input-output terminal and a second input-output terminal, a first input signal is generated in the first circuit inputted into the first input-output terminal, a first output signal is outputted from the second input-output terminal to the second circuit, a second input signal is generated in the second circuit inputted into the second input-output terminal, a second output signal is outputted from the first input-output terminal to the first circuit. The level shift switch includes a transmission circuit, a second transistor, a third transistor, and a first one-shot pulse generation circuit. The transmission circuit includes a first transistor, the transmission circuit transmits a signal between the first input-output terminal and the second input-output terminal, the first transistor has one end connected to the first input-output terminal and the other end connected to the second input-output terminal. The second transistor has one end connected to a first power supply and the other end connected to the first input-output terminal. The third transistor has one end connected to a second power supply and the other end connected to the second input-output terminal. The first one-shot pulse generation circuit includes a fourth transistor and a fifth transistor, the first one-shot pulse generation circuit is provided between the first input-output terminal and the second input-output terminal, the first one-shot pulse generation circuit outputs a one-shot pulse signal to the second transistor and the third transistor, a first signal is inputted into the fourth transistor not through a delay circuit but through the first input-output terminal, a second signal is inputted into the fifth transistor, the second signal is generated by delaying and inverting the first signal, the fifth transistor has one end to output a first one-shot pulse signal and the other end connected to the fourth transistor.

Embodiments will be described with reference to drawings. In the drawings, the same reference numerals denote the same or similar portions.

Figure 2:
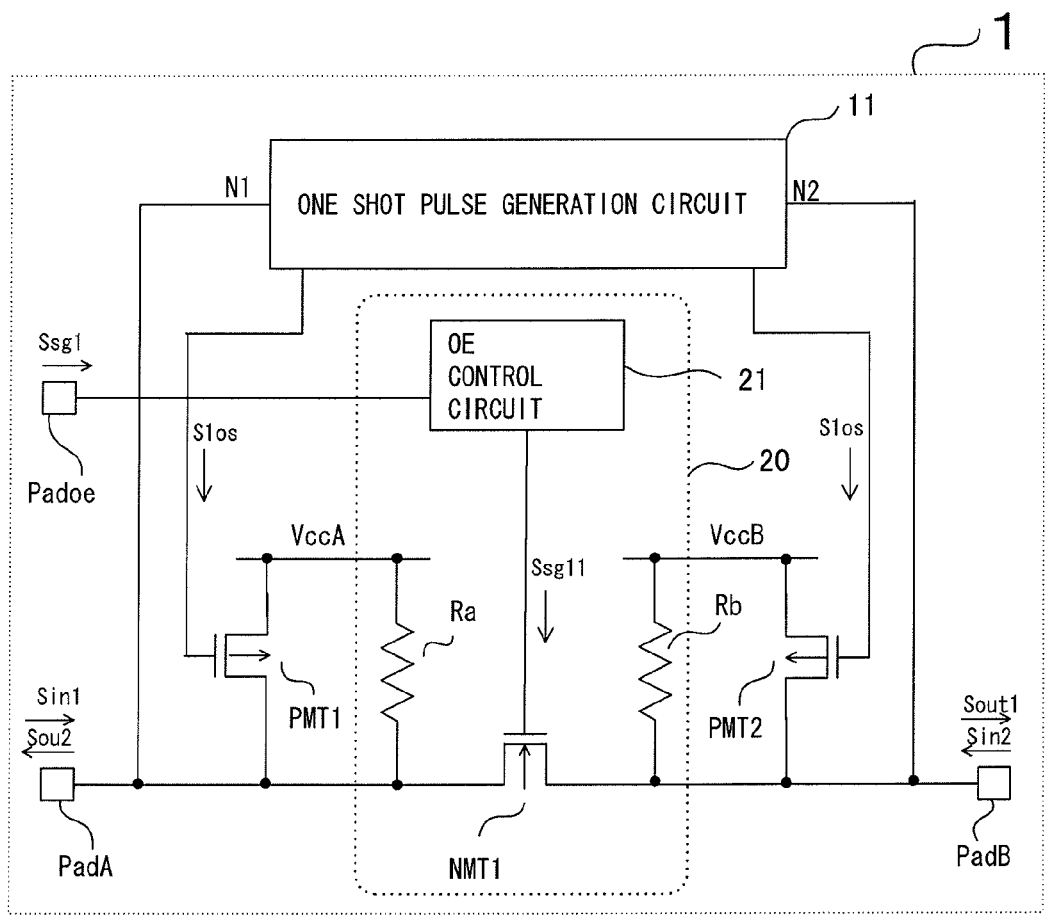
FIG. 2 is a circuit diagram showing a configuration of a level shift switch according to the first embodiment.
Figure 3:
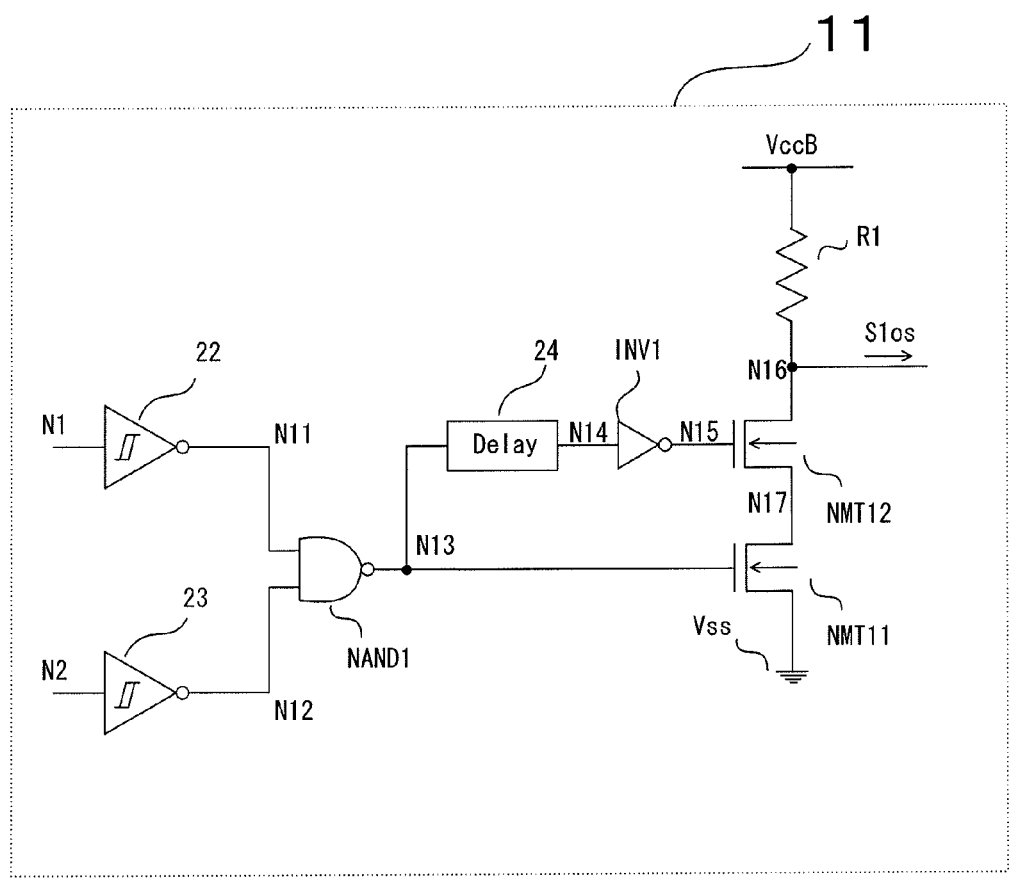
FIG. 3 is a circuit diagram showing a configuration of a one-shot pulse generation circuit according to the first embodiment.
Figure 4:
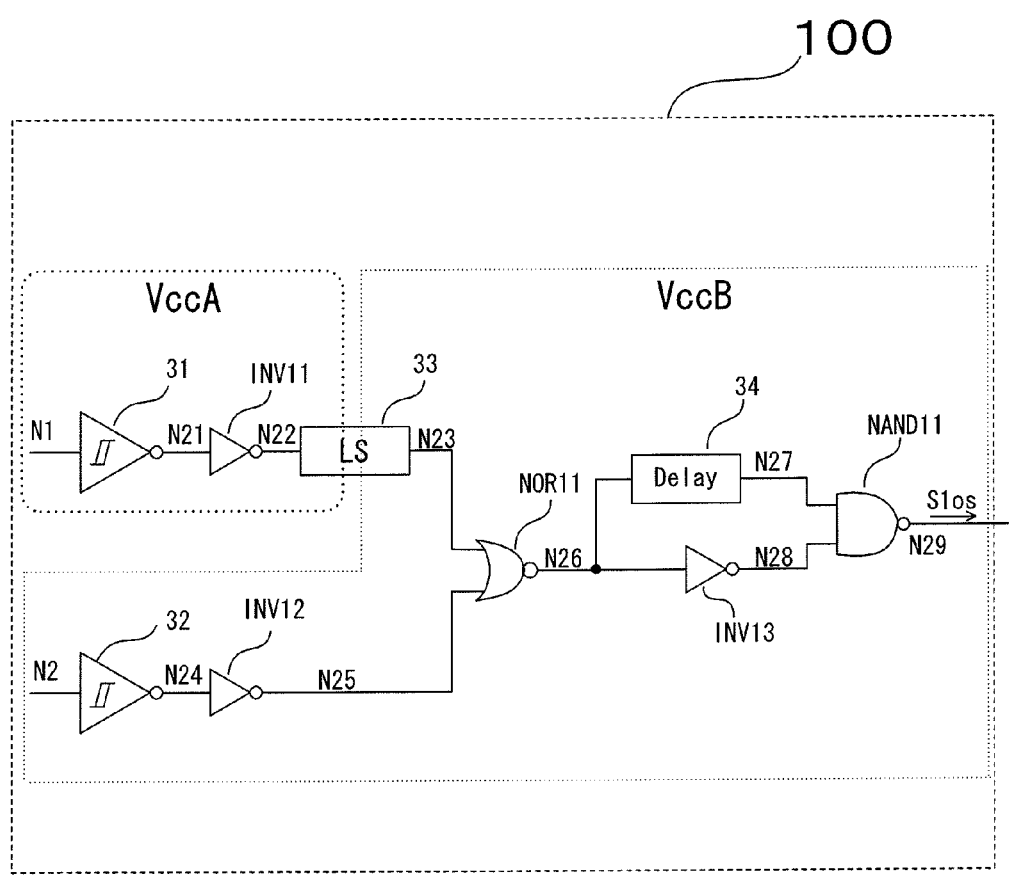
FIG. 4 is a circuit diagram showing a configuration of a one-shot pulse generation circuit of a comparative example according to the first embodiment.

A level shift-switch and an electronic device including the switch according to a first embodiment will be described with reference to drawing. FIG. 1 is a schematic configuration diagram showing the electronic device. FIG. 2 is a circuit diagram showing a configuration of a level shift switch. FIG. 3 is a circuit diagram showing a configuration of a one-shot pulse generation circuit. FIG. 4 is a circuit diagram showing a configuration of a one-shot pulse generation circuit of a comparative example. The first embodiment speeds up a signal transmission of the duplex level shift switch.

As shown in FIG. 1, an electronic device 90 includes a level shift switch 1, a VccA system 2 (a first power supply system), and a VccB system 3 (a second power supply system). The VccA system 2 is supplied with a high voltage power supply VccA (a first power supply) to execute signal processing, arithmetic processing, etc. The VccB system 3 is supplied with a high voltage power supply VccB (a second power supply) to execute signal processing, etc. The first power supply system and the second power supply system are referred to also as a first circuit and a second circuit, respectively.

The level shift switch 1 is provided between the VccA system 2 and the VccB system 3 to be supplied with the high voltage power supply VccA and the high voltage power supply VccB. The level shift switch 1 does not require a switching signal (DIR control signal), and is a duplex level shift switch. The level shift switch 1 receives an input signal Sin1 (a first input signal) from the VccA system 2. The level shift switch 1 outputs an output signal Sout1 (a first output signal) generated by level-shifting and accelerating to the VccB system. The level shift switch 1 receives an input signal (a second input signal) from the VccB system. The level shift switch 1 outputs an output signal (a second output signal) generated by level-shifting and accelerating to the VccA system. The level shift switch 1 speeds up signal transmission to be later described in detail.

A magnitude relation between a voltage Vcca of the high voltage power supply VccA and a voltage Vccb of the high voltage power supply VccB is set to be expressed as follows:

$$Vcca \leq Vccb \quad \text{(Formula 1)}$$

$$1.5V \leq Vcca, Vccb \leq 5.5V \quad \text{(Formula 2)}.$$

The level shift switch 1 is referred to also as a 2-power supply bus switch circuit, and is used as a SM BUS (system management bus), an I²C, etc. The VccA system 2 includes a CPU (central processing unit) and DSP (digital signal processor), both executing signal processing at a comparatively low voltage. The VccB system 3 includes an I/O interface unit and an analog unit, both executing signal processing at a comparatively high voltage, and a memory card with operating voltage thereof standardized. The electronic device 90 is used for a mobile terminal, that requires low power consumption and rapid transmission, and also used for a PDA (personal digital assistant), consumer electronics devices including cameras, and industrial electronics devices.

As shown in FIG. 2, the level shift switch 1 includes a one-shot pulse generation circuit 11, a transmission circuit 20, a Pch MOS transistor PMT1, a Pch MOS transistor PMT2, a terminal PadA, a terminal PadB, and a terminal Padoe. The MOS transistor is referred to also as a MOS FET (Metal Oxide Semiconductor Field Effect Transistor).

The terminal PadA (a first I/O terminal) receives the input signal Sin1 from the VccA system 2, and the VccA system 2 is supplied with the output signal Sout2 generated by level-shifting and accelerating the input signal Sin1 and sharpening pulse edges of the input signal Sin2 via the terminal PadA. The terminal PadB (a second I/O terminal) receives the input signal Sin2 from the VccB system 3, and the VccB system 3 is supplied with the output signal Sout1 generated by level-shifting and accelerating the input signal Sin1 via the terminal PadB. The terminal Padoe (a control terminal) receives a signal to generate the signal Ssg1.

The one-shot pulse generation circuit 11 is provided between the terminal PadA and the terminal PadB. The one-shot pulse generation circuit 11 has one end connected to the terminal PadA (a node N1) and the other end connected to the terminal PadB (a node N2). The one-shot pulse generation circuit 11 outputs a signal S1os.

The transmission circuit 20 includes an OE control circuit 21, an Nch MOS transistor NMT1, a resistance Ra, and a resistance Rb. The transmission circuit 20 transmits signals between the terminal PadA and the terminal PadB.

The OE control circuit 21 is provided between the terminal Padoe and a gate of the Nch MOS transistor NMT1. The OE control circuit 21 receives the signal Ssg1 and outputs a signal Ssg11 (a control signal) to the gate (a control terminal) of the Nch MOS transistor NMT1. A signal voltage of the signal ssg11 is based on the VccA power supply.

One end of the Nch MOS transistor NMT1 (a first transistor) is connected to the terminal PadA, and the other end of the Nch MOS transistor NMT1 is connected to the terminal PadB. When the Nch MOS transistor NMT1 receives the signal Ssg11 with an ENABLE state (here, a High level) at the gate, the Nch MOS transistor NMT1 transmits a signal between the terminal PadA and the terminal PadB.

One end of the resistance Ra is connected to the high voltage power supply VccA, and the other end of the resistance Ra is connected to the terminal PadA. One end of the resistance Rb is connected to the high voltage power supply VccB, and the other end of the resistance Rb is connected to the terminal PadB. The resistance Ra and the resistance Rb operate as a pull-up resistor.

The Pch MOS transistor PMT1 (a second transistor) has the source (one end) connected to the high voltage power supply VccA, the drain (the other end) connected to the terminal PadA, and the gate (a control terminal) being input a signal S1os (a one-shot pulse signal) from the one-shot pulse generation circuit 11. The Pch MOS transistor PMT2 (a third transistor) has the source (one end) connected to the high voltage power supply VccB, the drain (the other end) connected to the terminal PadB, and the gate (a control terminal)

being input a signal (a one-shot pulse signal) S1os from the one-shot pulse generation circuit 11. The signal S1os is a signal (a first one-shot pulse signal) to accelerate rising edges of the input signal Sin1 and the input signal Sin2.

When the input signal Sin1 or the input signal Sin2 changes from a Low level to the High level at the rising time, the signal S1os has a pulse width (time period) of a one-shot pulse in an ENABLE condition (here, the Low level). As a result, the Pch MOS transistors PMT1 and the Pch MOS transistor PMT2 are turned on during the pulse width to accelerate a rising edge of the signal.

Although the signal S1os has a voltage level of Vccb and has a voltage higher than a source/drain voltage of the Pch MOS transistor PMT1 at the High level, the voltage higher than the source/drain voltage causes no problem with ON/OFF operation of the Pch MOS transistor PMT1 by selecting an element causing no breakdown voltage in the Pch MOS transistor PMT1.

As shown in FIG. 3, the one-shot pulse generation circuit 11 includes a Schmitt circuit 22, a Schmitt circuit 23, a delay circuit 24, a 2-input NAND circuit NAND1, an inverter INV1, an Nch MOS transistor NMT11, an Nch MOS transistor NMT12, and a resistance R1.

The Schmitt circuit 22 is referred to as a Schmitt inverter, and has an input side connected to the node N1 and an output side connected to the node N11. When a voltage of the node N1 changes from the Low level to the High level, the Schmitt circuit 22 outputs a signal changing from the High level to the Low level from the node N11. The Schmitt circuit 23 is referred to as a Schmitt inverter, and has an input side connected to a node N2 and an output side connected to a node N12. When a voltage of the node 2 changes from the Low level to the High level, the Schmitt circuit 23 outputs a signal changing from the High level to the Low level from the node N12. Although the Schmitt circuit 22 and the Schmitt circuit 23 are used, circuits working the same are not limited to these.

The 2-input NAND circuit NAND1 has the input side connected to the node N11 and the node N12 and the output side connected to the node N13. The 2-input NAND circuit NAND1 logically operates the signals from the node N11 and the node N12, and outputs the logically operated signal from the node N13.

The delay circuit 24 has one end connected to the node N13 and the other end connected to the node N14. The delay circuit 24 delays the signal from the nodes N13 by a predetermined time. The inverter INV1 has the input side connected to the node N14 and the output side connected to the node N15. The inverter INV1 inverts a signal from the node N14 and outputs the inverted signal from the node N15.

The resistance R1 has one end connected to the high voltage power supply VccB and the other end connected to the node N16. The Nch MOS transistor NMT11 (a fourth transistor) has the drain (one end) connected to the node N17, the source (the other end) connected to the low voltage power supply Vss (ground potential), and the gate (a control terminal) connected to the node N13. The Nch MOS transistor NMT12 (a fourth transistor) has the drain (one end) is connected to the node N16, the source (the other end) connected to the node N17, and the gate (a control terminal) connected to the node N15. The Nch MOS transistor NMT12 outputs a signal S1os (one-shot pulse signal) from the node N16 (the drain). The Nch MOS transistor NMT11 and the Nch MOS transistor NMT12 are series-connected.

When the node N13 and the node N15 are at the High level, and when the Nch MOS transistor NMT11 and the Nch MOS transistor NMT12 are turned on, the signal S1os has a pulse width of a one-shot pulse in an ENABLE state (here, the Low level). The pulse width is set as a sum of the signal delay time of the delay circuit 24 and the signal delay time of the inverter INV1.

Preferably, the high voltage power supply VccA is used for the Schmitt circuit 22, and the high voltage power supply VccB is used for the Schmitt circuit 23. The one-shot pulse generation circuit 11 includes the MOS transistor NMT11 and the Nch MOS transistor NMT12 on the output side. A power supply for the delay circuit 24, the 2-input NAND circuit NAND1, the inverter INV1, etc. is one having a lower voltage level of the high voltage power supply VccA and the high voltage power supply VccB. Preferably, the high voltage power supply VccA is selected in the embodiment.

As shown in FIG. 4, the one-shot pulse generation circuit 100 of the comparative example includes a Schmitt circuit 31, a Schmitt circuit 32, a level shift circuit 33, a delay circuit 34, a 2-input NAND circuit NAND11, a 2-input NOR circuit NOR11, an inverter INV11, an inverter INV12, and an inverter INV13.

A level shift switch (not shown) of the comparative example has the same configuration as the level shift switch 1 of the embodiment, except for the configuration of the one-shot pulse generation circuit 100. Description of the same configuration will not be repeated.

The Schmitt circuit 31 and the inverter INV11 are supplied with power from the high voltage power supply VccA. The Schmitt circuit 32, the delay circuit 34, the 2-input NAND circuit NAND11, the 2-input NOR circuit NOR11, the inverter INV12, and the inverter INV13 are supplied with power from the high voltage power supply VccB. The level shift circuit 33 is supplied with power from both the high voltage power supply VccA and the high voltage power supply VccB.

The level shift switch in the one-shot pulse generation circuit 100 of the comparative example has a longer signal transmission time than that in the one-shot pulse generation circuit 11 of the embodiment.

The Schmitt circuit 31 has the input side connected to the node N1 and the output side connected to the node N21. The inverter INV11 inverts a signal from the node N21 and outputs the inverted signal from the node N22. The level shift circuit 33 level-shifts a signal at the node 22 and outputs the signal with the level-shifted voltage from the node 23. The level shift circuit 33 includes a cross coupled circuit, etc. that causes a long delay of signal in comparison with logic circuits including NAND circuits, etc.

The Schmitt circuit 32 has the input side connected to the node N2 and the output side connected to the node N24. The inverter INV12 inverts a signal of the node N24 and outputs the inverted signal from the node N25.

The 2-input NOR circuit NOR11 has the first input side connected to the node N23, the second input side connected to the node N25, and the output side connected to the node N26. The 2-input NOR circuit NOR11 logically operates a signal of the node N23 and a signal of the node N25, and outputs the logically operated signal from the node N26.

The delay circuit 34 has one end connected to the node N26 and the other end connected to the node N27. The delay circuit 34 delays a signal of the node N26 by a predetermined time. The inverter INV13 inverts a signal of the node N26 and outputs the inverted signal from the node N28.

The 2-input NAND circuit NAND 11 has the first input side connected to the nodes N27, the second input side connected to the N28, and the output side connected to the node N29. The 2-input NAND circuit NAND 11 logically operates a signal of the nodes N27 and a signal of the N28, and outputs the logically operated signal from the node N29.

Figure 6:
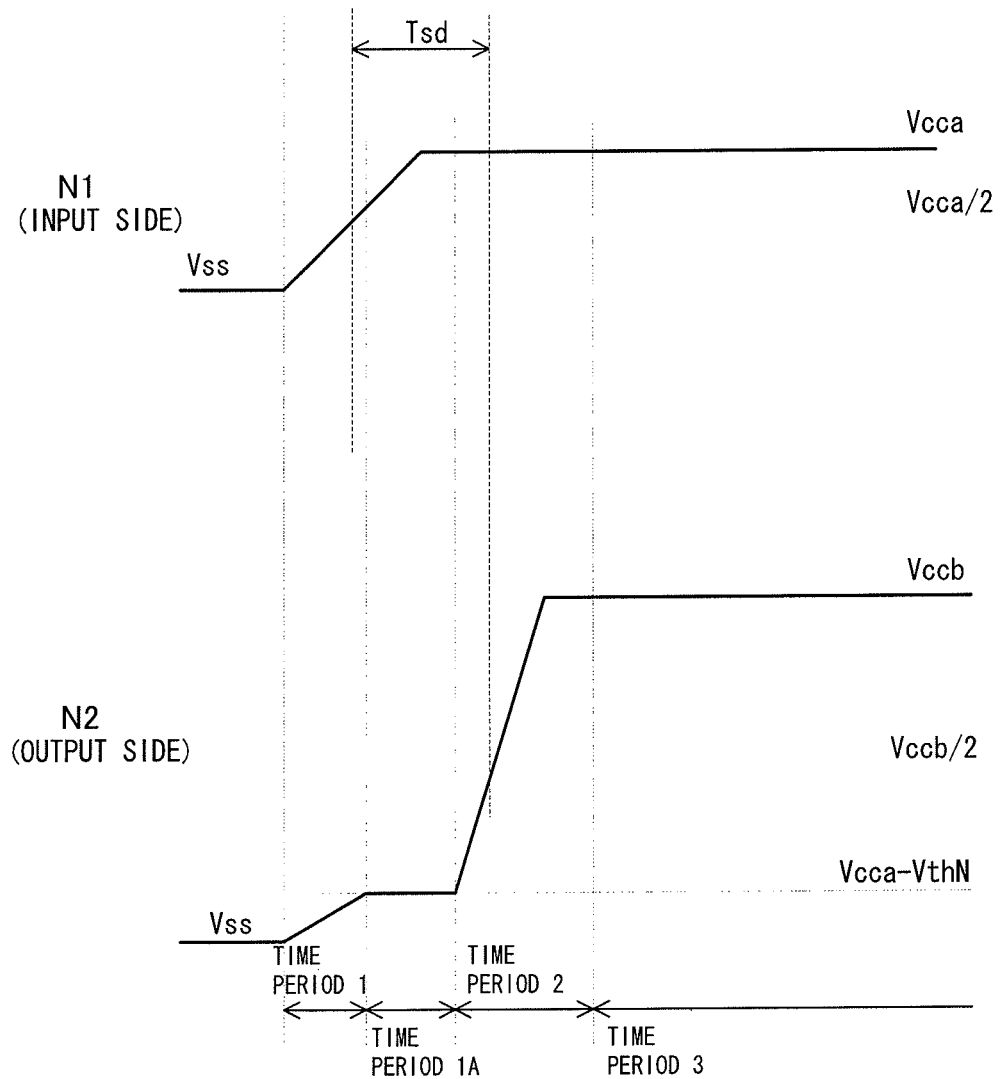
FIG. 6 is a timing chart showing an operation of the level shift switch according to the first embodiment.
Figure 8:
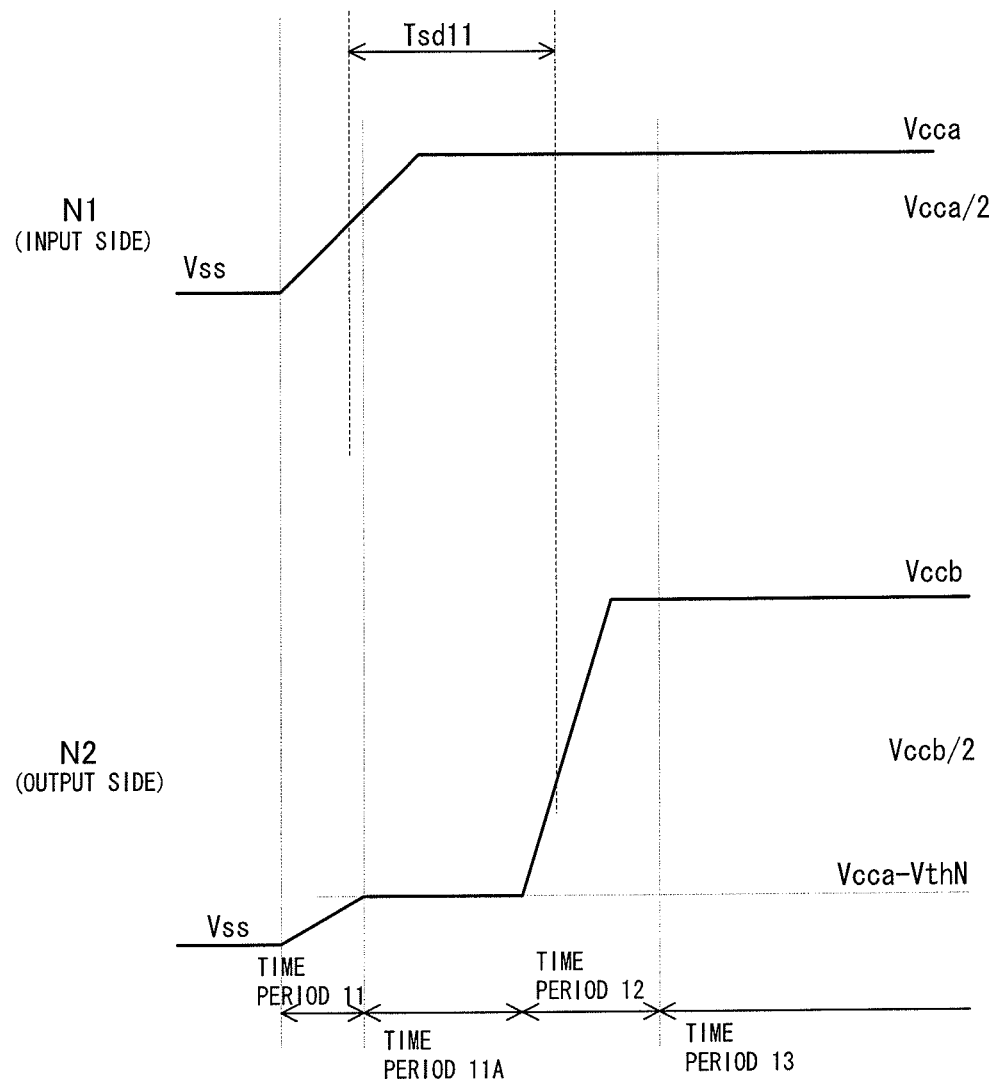
FIG. 8 is a timing chart showing an operation of the level shift switch of the comparative example according to the first embodiment.

Operation of a level shift switch will be described with reference to FIGS. 5 to 8. FIG. 5 is a diagram describing the operation of the level shift switch. FIG. 6 is a timing chart showing the operation of the level shift switch. FIG. 7 is a diagram describing operation of a level shift switch of a comparative example. FIG. 8 is a timing chart showing the operation of the level shift switch of the comparative example. An input signal Sin1 is input into the terminal PadA, and the output signal Sout1 level-shifted is output from the terminal PadB.

Operation of the level shift switch 1 of the embodiment will be described with reference to FIGS. 5 and 6. The transmission circuit 20 is reportedly slow in transmitting a level change from the Low level to the High level. The operation of the transmission circuit 20 for the level change will be described.

When the terminal PadA receives the input signal Sin1, and when the signal level on the node N1 starts to change from the Low level to the High level, the Nch MOS transistor NMT1 starts to operate, thereby increasing the voltage of the node N2.

When the voltage of the node N1 reaches a circuit threshold voltage, for example, Vcca/2, the one-shot pulse generation circuit 11 starts to operate. After a predetermine time has passed, the voltage of the node N2 reaches a value of (Vcca−VthN). A period of time, in which the voltage of the node N1 starts to change from the Low level to the High level until the voltage of the node N2 reaches (Vcca−VthN), is expressed as a Time Period 1.

Subsequently, when the voltage of the node N1 continues to increase (the voltage of the node N2 is kept at (Vcca−VthN)), and when the Nch MOS transistor NMT11 and the Nch MOS transistor NMT12 turn on, and when the signal S1ops (an one-shot pulse signal) in an ENABLE state is output from the node N16, the Pch MOS transistor PMT1 and the Pch MOS transistor PMT2 starts to operate, and the voltage of the node N2 starts increase. A period of time, in which the voltage of the node N2 is kept at (Vcca−VthN), is expressed as a Time Period 1A.

When the signal S1os (the one-shot pulse signal) is kept in the ENABLE state, and when the Pch MOS transistor PMT1 and the Pch MOS transistor PMT2 continue to operate, the voltage of the node N2 reaches Vccb/2, and then the voltage of the node N2 rises at accelerated rate by the operation of the Pch MOS transistor PMT2. Thereby, the voltage of the node N2 reaches Vccb.

When the signal S1os (the one-shot pulse signal) changes in a DISABLE state (from the Low level to the High level), the Pch MOS transistor PMT1 and the Pch MOS transistor PMT2 stop to operate. At this time, the voltage of the node N2 is kept at Vccb. The pulse width of the one-shot pulse in the DISABLE state (here, the Low level) is expressed as a Time Period 2.

After the one-shot pulse generation circuit 11 is tuned off, the voltage of the node N2 is kept at Vccb by the resistance Ra and the resistance Rb. A period on and after the one-shot pulse generation circuit 11 is tuned off is expressed as a Time Period 3. A period of time, in which the voltage of the node N1 reaches Vcca/2 until the voltage of the node N2 reaches Vccb/2, is expressed as a signal transmission time Tsd of the level shift switch 1.

A level shift switch including the one-shot pulse generation circuit 100 of the comparative example will be described with reference to FIGS. 8 and 9.

A signal input changing from the Low level to the High level will be described for the level shift switch of the comparative example. When the terminal PadA receives an input signal Sin1, and when the signal level of the node N1 starts to change from the Low level to the High level, the Nch MOS transistor NMT1 starts to operate, and then the voltage of the node N2 starts to increase.

When the voltage of the node N1 reaches a circuit threshold voltage (e.g., Vcca/2), the one-shot pulse generation circuit starts to operate. After a predetermine time has passed, the voltage of the node N2 reaches a value of (Vcca−VthN). A period of time, in which the voltage of the node N1 starts to change from the Low level to the High level until the voltage of the node N2 reaches (Vcca−VthN), is expressed as a Time Period 11.

Subsequently, when the voltage of the node N1 continues to increase (the voltage is kept at (Vcca−VthN)), and when a signal S1os of the node N29 on the output side of the 2-input NAND circuit NAND11 changes from a DISABLE state (High level) to an ENABLE state (Low level), the Pch MOS transistor PMT1 and the Pch MOS transistor PMT2 start to operate, and then the voltage of the node N2 starts to increase. A period of time, in which the voltage of the node N2 is kept at (Vcca−VthN), is expressed as a time Period 11A.

When the signal S1os (one-shot pulse signal) is kept in an ENABLE state (the Low level), and when the Pch MOS transistor PMT1 and the Pch MOS transistor PMT2 continue to operate, the voltage of the node N2 reaches Vcc/2, and then the voltage of the node N2 rises at an accelerated rate. Thereby, the voltage of the node N2 reaches Vccb.

When the signal S1os (one-shot pulse signal) is changed to a DISABLE state (from the Low level to the High level), the Pch MOS transistor PMT1 and the Pch MOS transistor PMT2 stop to operate. At this time, the voltage of the node N2 is kept at Vccb. A pulse width of a one-shot pulse in an ENABLE state (here, the Low level) is expressed as a Time Period 12.

After the one-shot pulse generation circuit 11 is tuned off, the voltage is kept at Vccb by the resistance Ra and the resistance Rb. A period on and after the one-shot pulse generation circuit 100 is tuned off is expressed as a Time Period 13. A period of time, in which the voltage of the node N1 reaches Vcca/2 until the time that the voltage of the node N2 reaches Vccb/2, is expressed as a signal transmission time Tsd11 of the level shift switch.

The Time Period 1, the Time Period 1A, and the Time Period 2 of the embodiment will be compared with the Time Period 11, the Time Period 11A, and the Time Period 12 of the comparative example.

The Time Period 1 has the same level as the Time Period 11. The Time Period 2 and the Time Period 12, which are ENABLE periods of time (one-shot pulse width), are normally set at the same level in order to accelerate a signal level-shifted at rising edges of input-signal pulses. In contrast to the one-shot pulse generation circuit 11 of the embodiment, the one-shot pulse generation circuit 100 of the comparative example includes a plurality of logic circuits and delay circuits which are series-connected, and the level shift circuit 33 having a large signal delay. Thereby, a relation between a time t1A of the Time Period 1A and a time t11A of the Time Period 11A is expressed as follows:

$$t1A \ll t11A \tag{Formula 3}$$

A signal transmission time of a level shift switch will be described with reference to FIG. 9.

Figure 9:
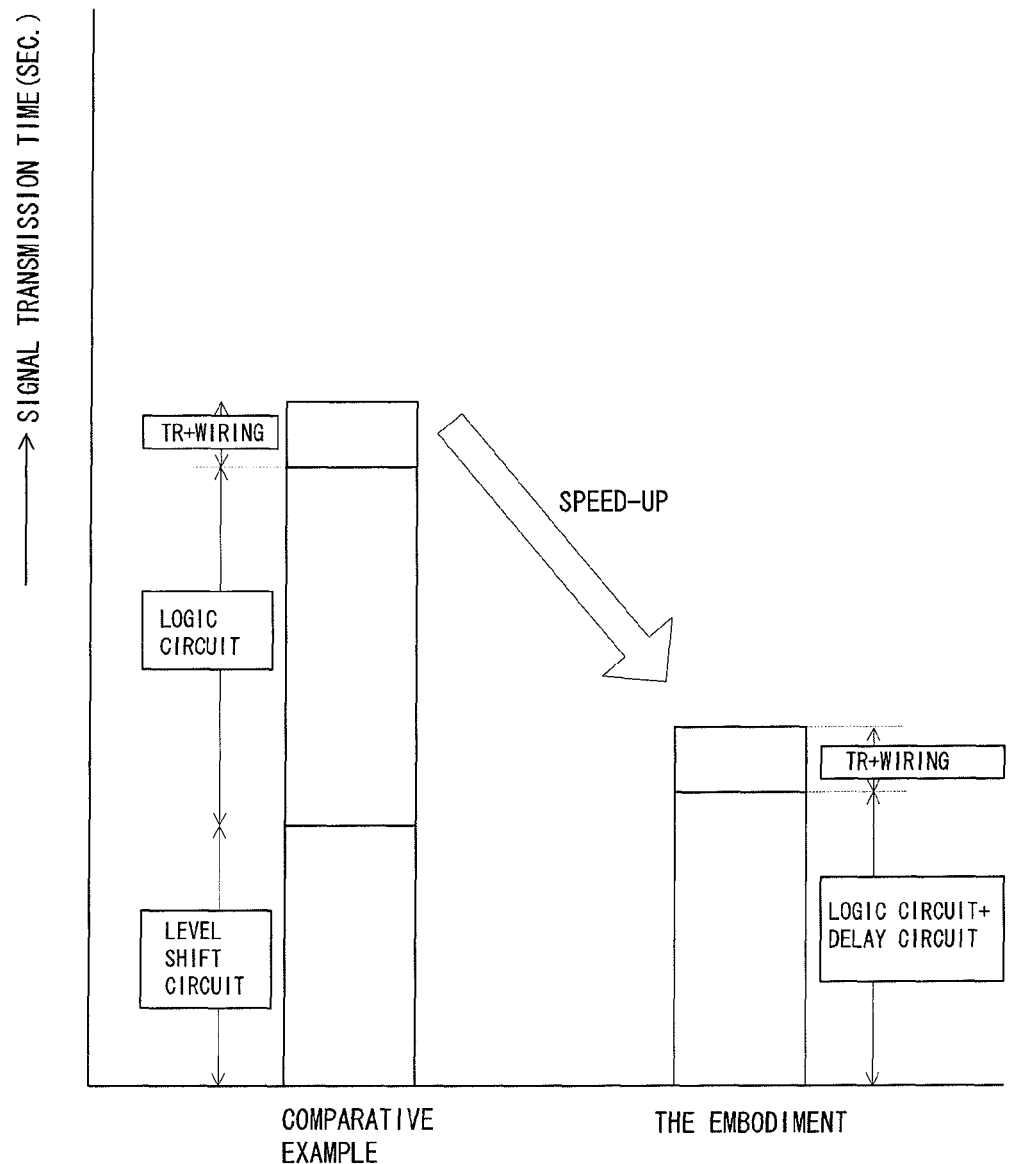
FIG. 9 is a diagram describing a signal transmission time of the level shift switch according to the first embodiment.

As shown in FIG. 9, in the signal transmission time of the level shift switch, a relation of the signal transmission time Tsd of the embodiment (the level shift switch 1) and the signal transmission time Tsd11 of the comparative example is expressed as follows:

$$Tsd \ll Tsd11 \tag{Formula 4}$$

It is possible to accelerate substantially the operation of the level shift switch 1 of the embodiment.

The above relation is based on the fact that the one-shot pulse generation circuit 100 of the comparative example includes the level shift circuit 33 having more signal delay than the logic circuit.

Signal delay, which arises from the Nch MOS transistor NMT11, the Nch MOS transistor NMT12, the Pch MOS transistor PMT1, the Pch MOS transistor PMT2 and the wiring, is much less than signal delay of the logic circuit.

As described above, the electronic device 90 includes the level shift switch 1, the VccA system 2, and the VccB system 3. The level shift switch 1 does not require a switching signal (DIR control signal), and is a duplex level shift switch. The level shift switch 1 receives the input signal Sin1 from the VccA system 2 through the terminal PadA and outputs the output signal Sout1 generated by level-shifting and accelerating to the VccB system 3 through the terminal PadB. The level shift switch 1 receives the input Sin2 from the VccB system 3 through the terminal PadB and outputs the output signal Sout2 generated by level-shifting and accelerating to the VccA system through the terminal PadA. The one-shot pulse generation circuit 11 provided to the level shift switch 1 includes the Schmitt circuit 22, the Schmitt circuit 23, the delay circuit 24, the 2-input NAND circuit NAND1, the inverter INV1, the Nch MOS transistor NMT11, the Nch MOS transistor NMT12, and the resistance R1. The one-shot pulse generation circuit 11 includes the Nch MOS transistors NMT11 and the Nch MOS transistor NMT12, both being connected in series to the output side of the one-shot pulse generation circuit 11, and lacks a level shift circuit.

Therefore, it is possible to greatly shorten the signal transmission time Tsd of the level shift switch 1. It is possible to achieve fast data transmission between the VccA system 2 and the VccB system 3.

Figure 10:
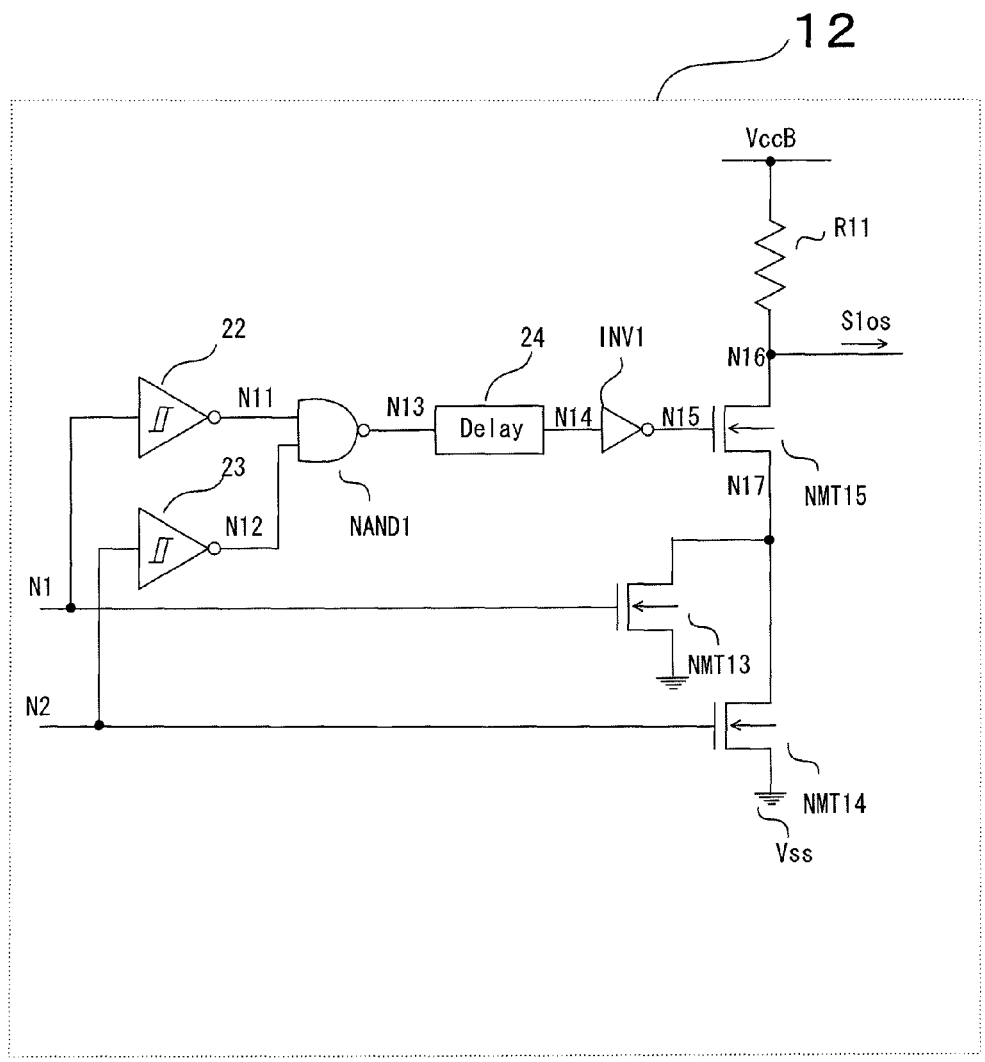
FIG. 10 is a circuit diagram showing a configuration of a one-shot pulse generation circuit according to a second embodiment.

A level shift switch according to a second embodiment will be described with reference to drawings. FIG. 10 is a circuit diagram showing a configuration of a one-shot pulse generation circuit. The second embodiment modifies the configuration of the one-shot pulse generation circuit.

Wherever possible, the same reference numerals or marks will be used to denote the same or like portions throughout the drawings, and the same description will not be repeated.

As shown in FIG. 10, a one-shot pulse generation circuits 12 includes the Schmitt circuit 22, the Schmitt circuit 23, the delay circuit 24, the 2-input NAND circuit NAND1, the inverter INV1, a Nch MOS transistors NMT13, a Nch MOS transistors NMT14, a Nch MOS transistors NMT15, and a resistance R11. The level shift switch 12 is referred to as a bus switch circuit etc., and is used as SM BUS, I²C, etc.

A level shift switch (not shown) of the second embodiment differs from that of the first embodiment just in the one-shot pulse generation circuit 12, and the description of the level shift switch will not be repeated. The level shift switch (not shown) of the embodiment does not require a switching signal (DIR control signal), being a duplex level shift switch.

One end of the resistance R11 is connected to the high voltage power supply VccB, and the other end of the resistance R11 is connected to the node N16. The drain (one end) of the Nch MOS transistor NMT13 (sixth transistor) is connected to the node N17, the source (the other end) of the Nch MOS transistor NMT13 is connected to the low voltage power supply Vss (ground potential), and the gate (a control terminal) of the Nch MOS transistor NMT13 is connected to the node N1. The drain (one end) of the Nch MOS transistor NMT14 is connected to the node N17, the source (the other end) of the Nch MOS transistor NMT14 is connected to the low voltage power supply Vss (ground potential), and the gate (a control terminal) of the Nch MOS transistor NMT14 is connected to the node N2. The drain (one end) of the Nch MOS transistor NMT15 is connected to the node N16, the source (the other end) the Nch MOS transistor NMT15 is connected to the node 17, and the gate (a control terminal) the Nch MOS transistor NMT15 is connected to the node N15. The Nch MOS transistor NMT15 outputs the signal S1os (one-shot pulse signal) from the node N16 side (on the side of the drain (one end)).

Each of the Nch MOS transistor NMT13 and the Nch MOS transistor NMT14 is connected between the node 17 and the low voltage power supply Vss (ground potential). The Nch MOS transistor NMT13 does not have a logic circuit between the node N1 and the gate of the Nch MOS transistor NMT13, thereby allowing the gate to be directly supplied with signals of the node N1. Accordingly, the Nch MOS transistor NMT13 contributes to signal transmission of the second embodiment, which is higher than that of the first embodiment. The Nch MOS transistor NMT14 has no logic circuits between the node N2 and the gate of the Nch MOS transistor NMT14, thereby allowing the gate to be directly supplied with signals of the node N2. Accordingly, the Nch MOS transistor NMT14 also contributes to signal transmission of the second embodiment, which is higher than that of the first embodiment.

As described above, the one-shot pulse generation circuit 12 of the level shift circuit includes the Schmitt circuit 22, the Schmitt circuit 23, the delay circuit 24, the 2-input NAND circuit NAND1, the inverter INV1, the Nch MOS transistors NMT13 to NMT15, and the resistance R11 in the second embodiment. Each of the Nch MOS transistor NMT13 and the Nch MOS transistor NMT14 is connected between the node 17 and the low voltage power supply Vss (ground potential).

Therefore, it is possible to speed up the signal transmission time of the level shift switch with the one-shot pulse generation circuit 12 higher than that of the first embodiment. High-speed data transmission is enabled between the VccA system 2 and the VccB system 3.

Figure 11:
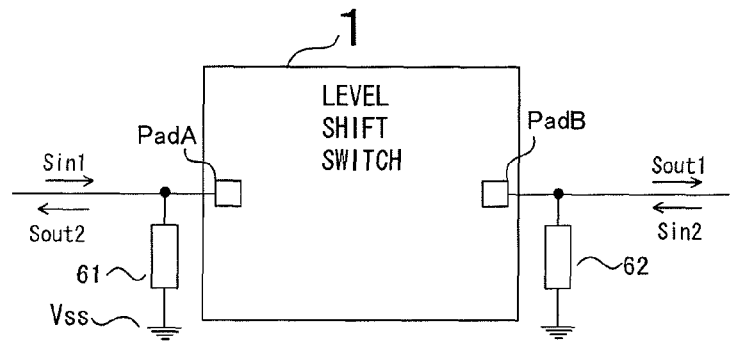
FIG. 11 is a diagram showing an input side and an output side of the level shift switch with heavy loads according to a third embodiment.
Figure 12:
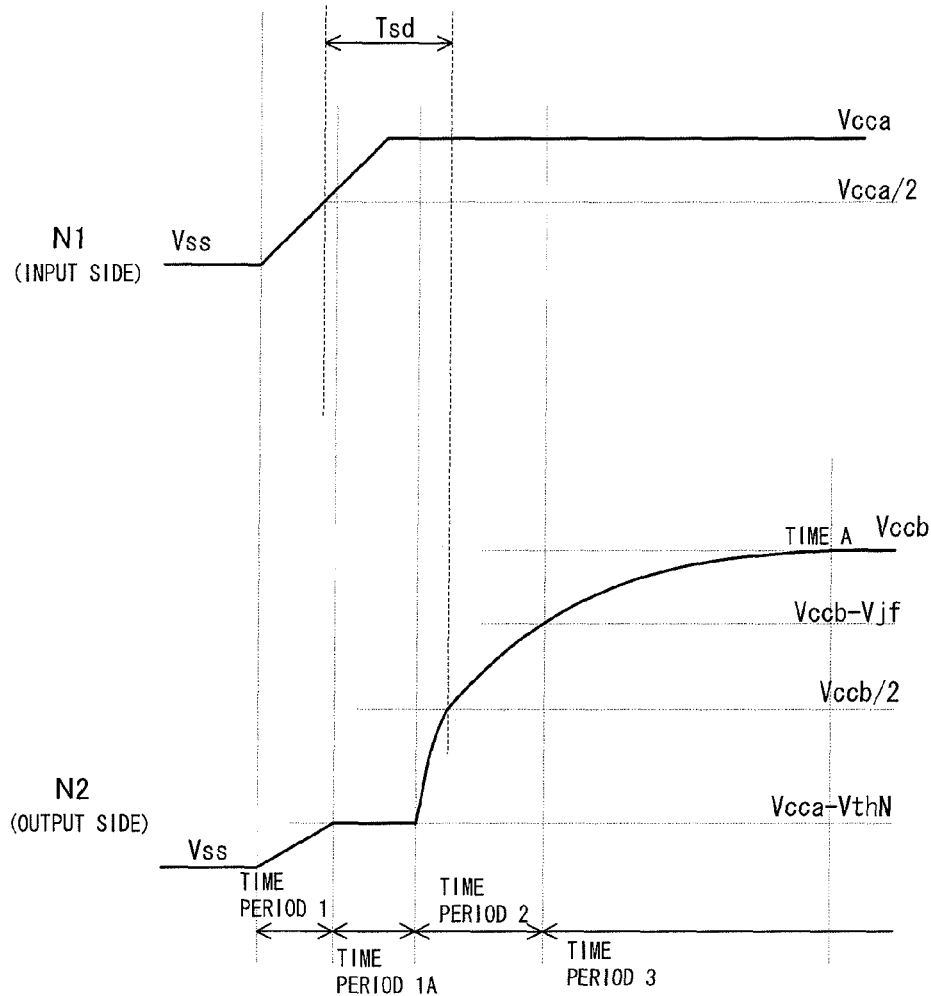
FIG. 12 is a diagram describing operation of the level shift switch with the heavy loads according to the third embodiment.
Figure 13:
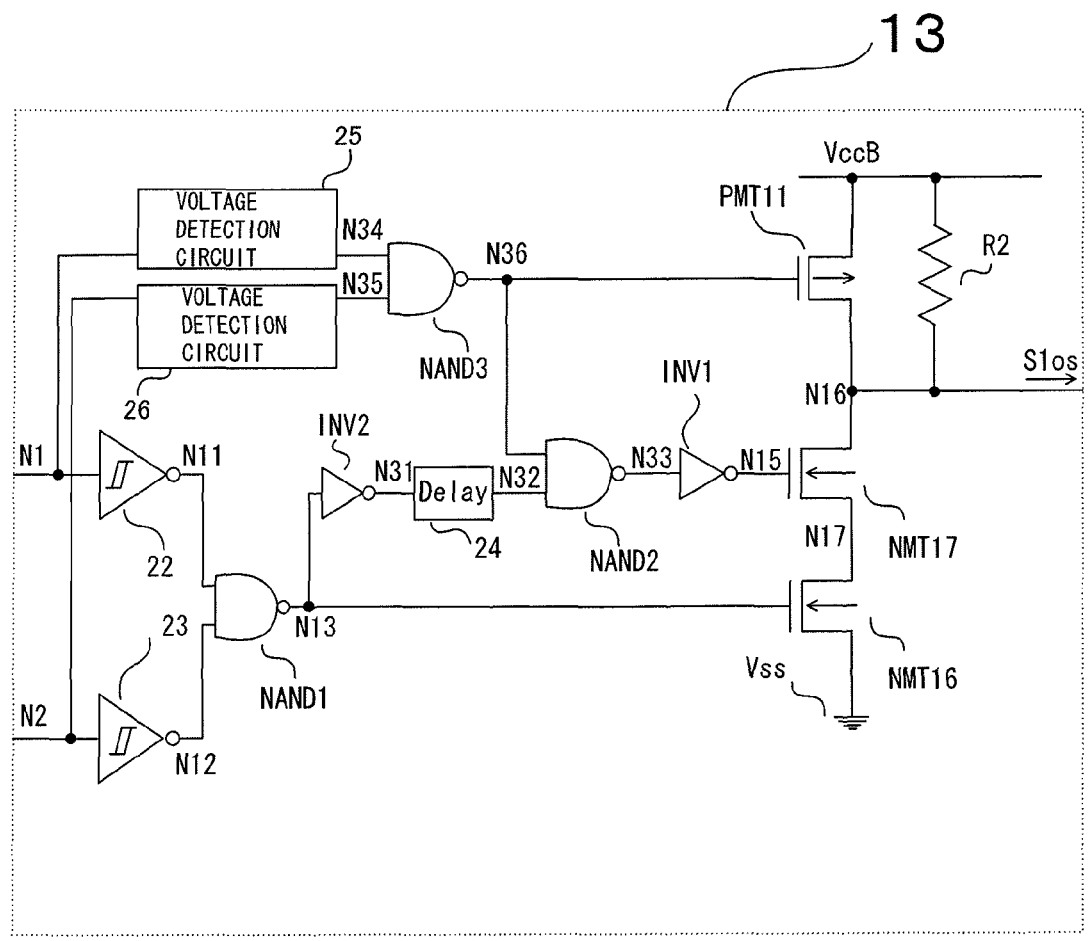
FIG. 13 is a circuit diagram showing a configuration of a one-shot pulse generation circuit according to the third embodiment.

A level shift switch according to a third embodiment will be described with reference to drawings. FIG. 11 is a diagram showing an input side and an output side of the level shift switch with heavy loads. FIG. 12 is a diagram describing operation of the level shift switch with the heavy loads. FIG. 13 is a circuit diagram showing a configuration of a one-shot pulse generation circuit. The one-shot pulse generation circuit of the embodiment enables to operate even when the one-shot pulse generation circuit is provided with a heavy load at an output side of an input-output terminal.

Wherever possible, the same reference numerals or marks will be used to denote the same or like portions throughout figures, and the same description will not be repeated in the third embodiment.

As shown in FIG. 11, a load 61 is provided between an output side of the terminal PadA of the level shift switch 1 and the low voltage power supply Vss (ground potential), and a load 62 is provided between an output side of the terminal PadB of the level shift switch 1 and the low voltage power supply Vss (ground potential). When the load 61 and the load 62 are heavy loads, the load 61 and the load 62 greatly influence characteristics of the level shift switch 1.

As shown in FIG. 12, the Pch MOS transistor PMT1 and the Pch MOS transistor PMT2 operate to rapidly increase a voltage of the node N2 for an ENABLE period (one-shot pulse width) of the one-shot pulse signal S1os in the one-shot pulse generation circuit 11.

The heavy loads, however, prevent the voltage at the node N2 from reaching the level Vccb, and allow the voltage of the node N2 to reach the level (Vccb−Vjf) when the Pch MOS transistor PMT1 and the Pch MOS transistor PMT2 are turned off. After the Pch MOS transistor PMT1 and the Pch MOS transistor PMT2 are turned off, the voltage of the node 2 is only increased by the resistance Ra and the resistance Rb, i.e., the pull-up resistors. Therefore, a time (Time A) that the voltage of the node N2 reaches the level (Vccb) in the third embodiment has a significant delay more than in the first embodiment with the heavy load.

As shown in FIG. 13, a one-shot pulse generation circuit 13 includes the Schmitt circuit 22, the Schmitt circuit 23, the delay circuit 24, a voltage detection circuit 25, a voltage detection circuit 26, the 2-input NAND circuits NAND 1, the 2-input NAND circuits NAND2, a 2-input NAND circuits NAND3, an inverter INV1, an inverter INV2, a Nch MOS transistor NMT16, a Nch MOS transistor NMT17, a Pch MOS transistor PMT11, and a resistance R2, in order to solve the problem.

A level shift switch (not shown) of the embodiment has the same configuration as the level shift switch 1 of the first embodiment, except for the configuration of the one-shot pulse generation circuit 13. The same description will not be repeated.

The voltage detection circuit 25 is provided between the node N1 and the node N34 and detects the voltage of the node N1, and then outputs the detection result from the node N34. The voltage detection circuit 26 is provided between the node N2 and the node N35 and detects the voltage at the node N2, and then outputs the detection result from the node N35.

The 2-input NAND circuit NAND3 is supplied with the high voltage power supply VccB, for example. The 2-input NAND circuit NAND3 has a first input side connected to the node N34, a second input side connected to the node N35, and an output side connected to the node N36. The 2-input NAND circuit NAND3 logically operates the signals of the node N34 and the node N35 and outputs the logically operated signal to the node N36.

The inverter INV2 receives a signal of the node N13, and inverts the signal of the node N13, and outputs the inverted signal from the node 31. The delay circuit 24 delays a signal of the node 31 by a predetermined time and outputs the delayed signal (fourth signal) from the node N32.

The 2-input NAND circuit NAND2 has a first input side connected to the node N32, a second input side connected to the node N36, and an output side connected to the node N33. The 2-input NAND circuit NAND2 logically operates the signals of the node N32 and the node N36 and outputs the logically operated signals from the node N33. The inverter INV1 receives a signal of the node N33 and inverts the signal of the node N33, and then outputs the inverted signal (the second signal) from the node N15.

The Pch MOS transistor PMT11 has one end connected to the high voltage power supply VccB, the other end connected to the node N16, and the gate (control terminal) connected to the node N36. One end of the resistance R2 is connected to the high voltage power supply VccB, and the other end thereof is connected to the node N16. The resistance R2 functions as a pull-up resistance.

The Nch MOS transistor NMT16 has the drain (one end) connected to the node N17, the source (the other end) connected to the low voltage power supply Vss, and the gate (control terminal) connected to the node N13. The Nch MOS transistor NMT17 has the drain (one end) connected to the node N16, the source (the other end) connected to the node N17, and the gate (control terminal) connected to the node N15.

The Nch MOS transistor NMT17 outputs a signal S1os (a one-shot pulse signal) from the node N16. The signal S1os (a one-shot pulse signal) has a pulse width in an ENABLE state (here, the Low level). During the pulse width, voltages of the node N13 and the node N15 reach the High level, thereby turning on the Nch MOS transistor NMT16 and the Nch MOS transistor NMT17.

Figure 14:
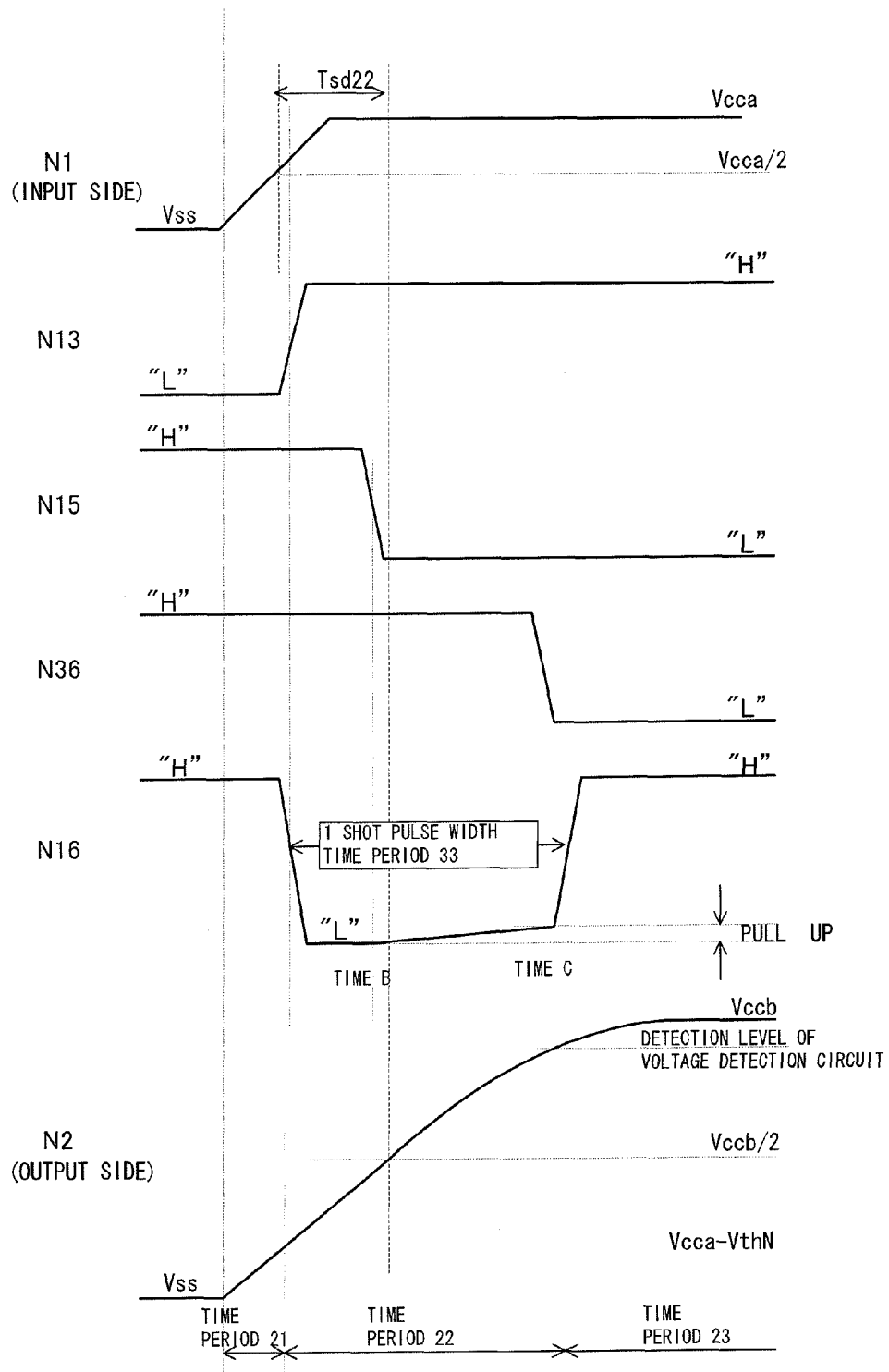
FIG. 14 is a timing chart showing the operation of the level shift switch with the heavy loads according to the third embodiment.

Operation of the level shift switch with heavy loads will be described with reference to FIG. 14. FIG. 14 is a timing chart showing the operation of the level shift switch with the heavy loads. FIG. 14 illustrates that the level shift switch receives the input signal Sin1 at the terminal PadA and outputs the output signal Sout1 generated by level-shifting from the terminal PadB.

As shown in FIG. 14, the level shift switch of this embodiment sets the OE control circuit 21 as to be turned off, and also sets the node N1 and the node N2, and the signal Ssg11 as to be at the Low level when the level shift switch is turned off.

When the OE control circuit 21 is turned on, the signal Ssg11 reaches the High level. When the input signal Sin1 is input into the terminal PadA and when the signal level of the node N1 starts to change from the Low level to the High level, the Nch MOS transistor NMT1 starts to operate, and then a voltage of the node N2 starts to increase.

Subsequently, the one-shot pulse generation circuit 13 starts to operate when the voltage of the node N1 reaches a circuit-threshold voltage, e.g., Vcca/2. After a predetermined time has passed, a voltage at the node N2 reaches (Vcca−VthN). A period of time, in which the voltage of the node N1 starts to change from the Low level to the High level until the voltage of the node N2 reaches (Vcca−VthN), is expressed as a Time Period 21.

When the voltage level of the node 13 changes from the Low level to the High level and when the voltage level of the node N15 is at the High level, the Nch MOS transistors NMT16 and NMT17 are turned on. Thereby, the voltage level of the node N16 decreases from the High level. When the voltage level of the node N16 is at the Low level and when the voltage level of the node 13 changes from the High level to the Low level, the Nch MOS transistor NMT16 and the Nch MOS transistor NMT17 are turned off (at the time B).

After the Nch MOS transistor NMT16 and the Nch MOS transistor NMT17 are turned off (at the time B), the resistance R2 as the pull-up resistance starts to raise the voltage level of the node N2. The rate of the rise is very low. Subsequently, the voltage level of the node N2 reaches the level of Vccb/2. A period of time, in which the voltage of the node N1 reaches Vcca/2 until the voltage of the node N2 reaches Vccb/2, is expressed as the signal transmission time period Tsd22.

When the voltage level of the node N2 reaches the detection level of the voltage detection circuit, the voltage level of the node N36 changes from the High level to the Low level. Thereby, the Pch MOS transistor PMT11 starts to operate (at the time C). Turning on the Pch MOS transistor PMT11 shifts the voltage of the node N16 to the High level. A period of time in which the voltage of the node N2 starts to change from the level (Vcca−VthN) until the voltage at node N2 reaches the detection level of the voltage detection level, is expressed as a Time Period 22. One-shot pulse width, in which the voltage of the node N16 starts to decrease until the voltage of the node N16 again reaches the High level, is expressed as one-shot pulse width time period 33. A time period after the Time Period 22 is expressed as a Time Period 23.

As a result, the one-shot pulse width time period 33 is set longer than that of the first embodiment. Thereby, it is possible to accelerate the signal transmission even when the level shift switch has the heavy load.

As described above, the one-shot pulse generation circuit 13 of the level shift switch of the embodiment includes the Schmitt circuit 22, the Schmitt circuit 23, the delay circuit 24, a voltage detection circuit 25, the voltage detection circuit 26, the 2-input NAND circuits NAND1 to NAND3, the inverter INV1, the inverter INV2, the Nch MOS transistor NMT16, the Nch MOS transistor NMT17, the Pch MOS transistor PMT11, and the resistance R2. The voltage detection circuit 25 detects a voltage level of the node N1, and the voltage detection circuit 26 detects a voltage level of the node N2. The resistance R2 operates to increases slowly the voltage of the node N16 from the Low level to the High level when the Nch MOS transistor NMT16 turns off the Nch MOS transistor NMT17. When the voltage of the node N2 reaches the detection level of the voltage detection circuit, the Pch MOS transistor PMT11 is turned on to set the voltage of the node N16 at the High level.

As a result, it is possible to accelerate the signal transmission of the level shift switch provided with the one-shot pulse generation circuit 13 even when the load 61 and the load 62 at the output side of the input-output terminal has a heavy load. The level shift switch achieves fast data transmission between the VccA system 2 and the VccB system 3.

Figure 15:
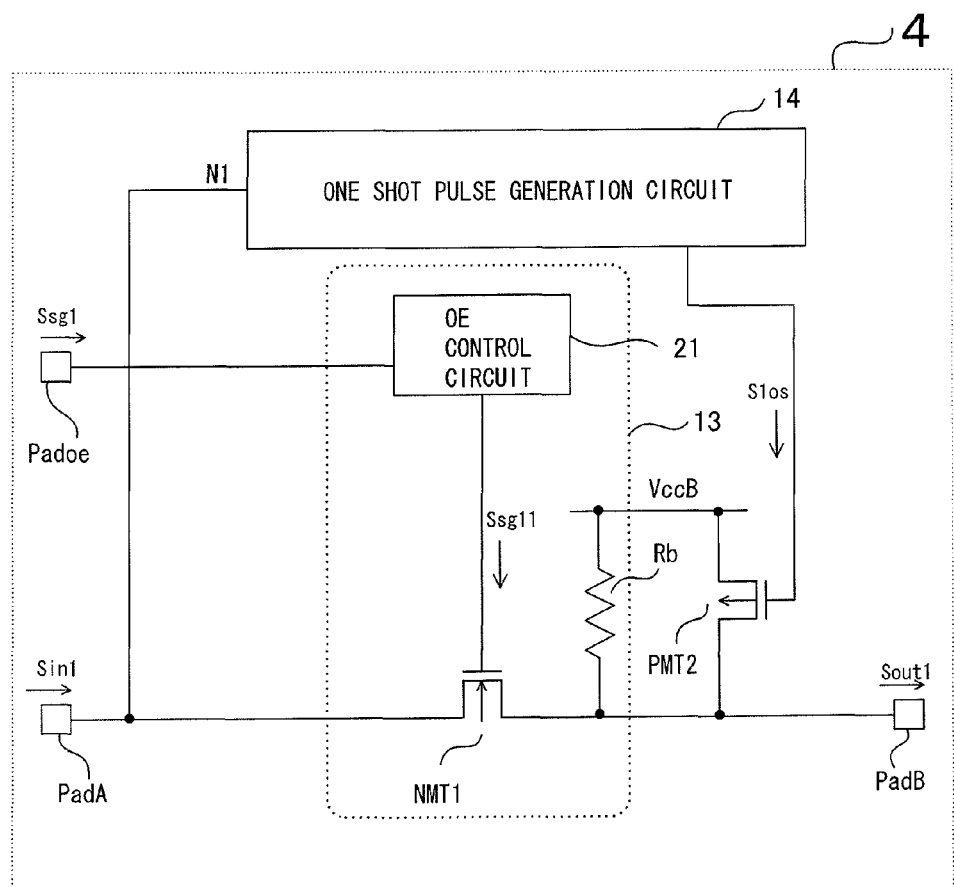
FIG. 15 is a circuit diagram showing a configuration of a level shift switch according to a fourth embodiment.
Figure 16:
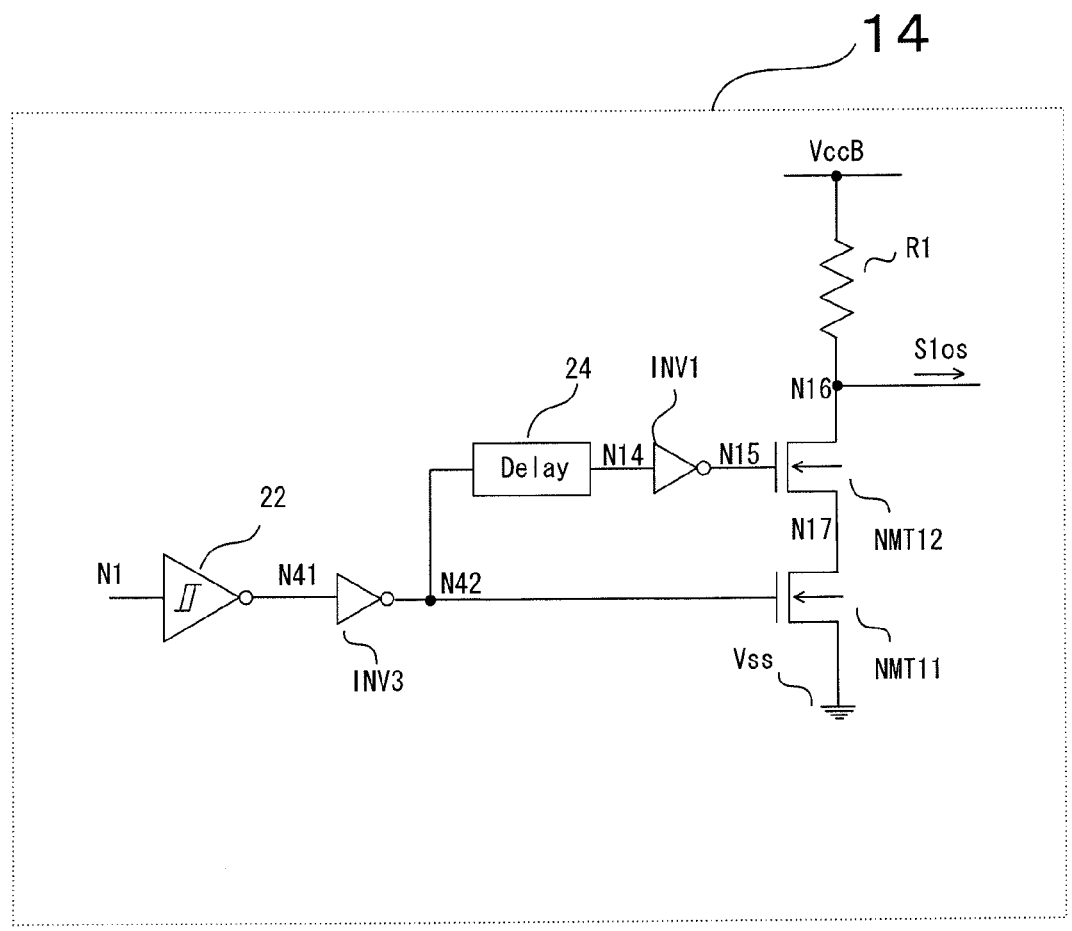
FIG. 16 is a circuit diagram showing a configuration of an one-shot pulse generation circuit according to the fourth embodiment.

A level shift switch in accordance with a fourth embodiment will be described with reference to drawings. FIG. 15 is a circuit diagram showing a configuration of the level shift switch. FIG. 16 is a circuit diagram showing a configuration of a one-shot pulse generation circuit. The fourth embodiment achieves fast signal transmission for one way of the level shift switch.

Wherever possible, the same reference numerals or marks will be used to denote the same or like portions throughout the drawings, and the same description will not be repeated.

As shown in FIG. 15, a level shift switch 4 includes a one-shot pulse generation circuit 14, a transmission circuit 13, and the Pch MOS transistor PMT2, a terminal PadA, a terminal PadB, and a terminal Padoe. The level shift switch 4 is configured for one-way fast signal transmission.

The level shift switch 4 receives, the input signal Sin1 through the terminal PadA, and outputs the output signal Sout2 generated by level-shifting and accelerating through the terminal PadB. When the level shift switch 4 receives the input signal Sin1 at the terminal PadA, the level shift switch 4 operates as well as the level shift switch 1 of the first embodiment.

As shown in FIG. 16, the one-shot pulse generation circuits 14 includes the Schmitt circuit 22, the delay circuit 24, the inverter INV1, the inverter INV3, the Nch MOS transistor NMT11, the Nch MOS transistor NMT12, and the resistance R1.

The Schmitt circuit 22 is also referred to as a Schmidt inverter. The Schmitt circuit 22 has the input side connected to the node N1 and the output side connected to the node N41. When the voltage of the node N11 changes from the Low level to the High level, the Schmitt circuit 22 outputs one pulse of the High level from the node N41. The inverter INV3 receives a signal of the node N41 and outputs the inverted signal from the node N42. The delay circuit 24 delays a signal of the node N42 a predetermined time and outputs the delayed signal from the node N14.

As mentioned above, the level shift switch of the embodiment includes the one-shot pulse generation circuit 14, the transmission circuit 13, and the Pch MOS transistor PMT2, the terminal PadA, the terminal PadB, and the terminal Padoe. The one-shot pulse generation circuits 14 includes the Schmitt circuit 22, the delay circuit 24, the inverter INV1, the inverter INV3, the Nch MOS transistor NMT11, the Nch MOS transistor NMT12, and the resistance R1.

As a result, the level switch 4 of a simplex type achieves fast signal transmission. Fast data transmission is also enabled between the VccA system 2 and the VccB system 3.

Figure 17:
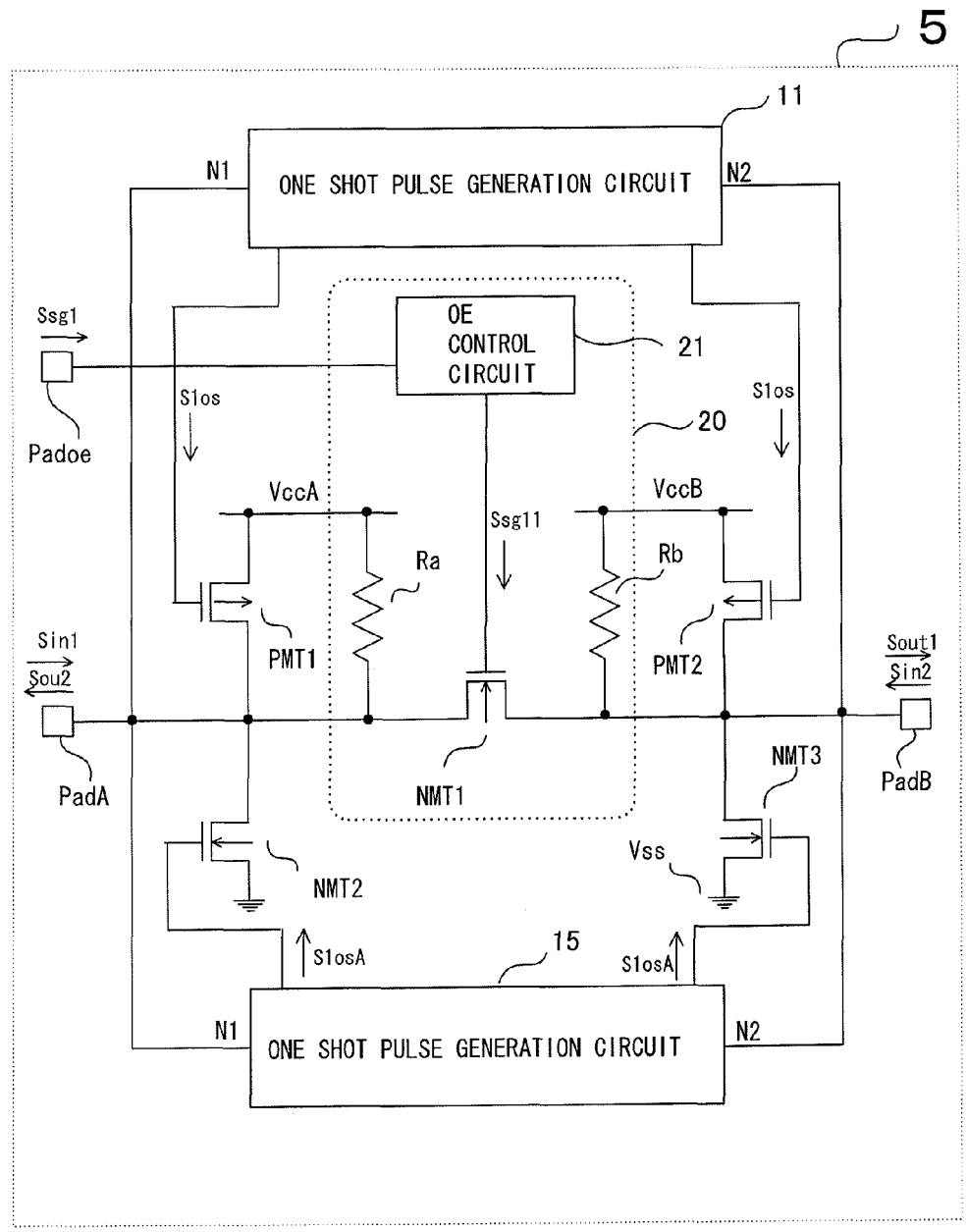
FIG. 17 is a circuit diagram showing a configuration of a level shift switch according to a fifth embodiment.
Figure 18:
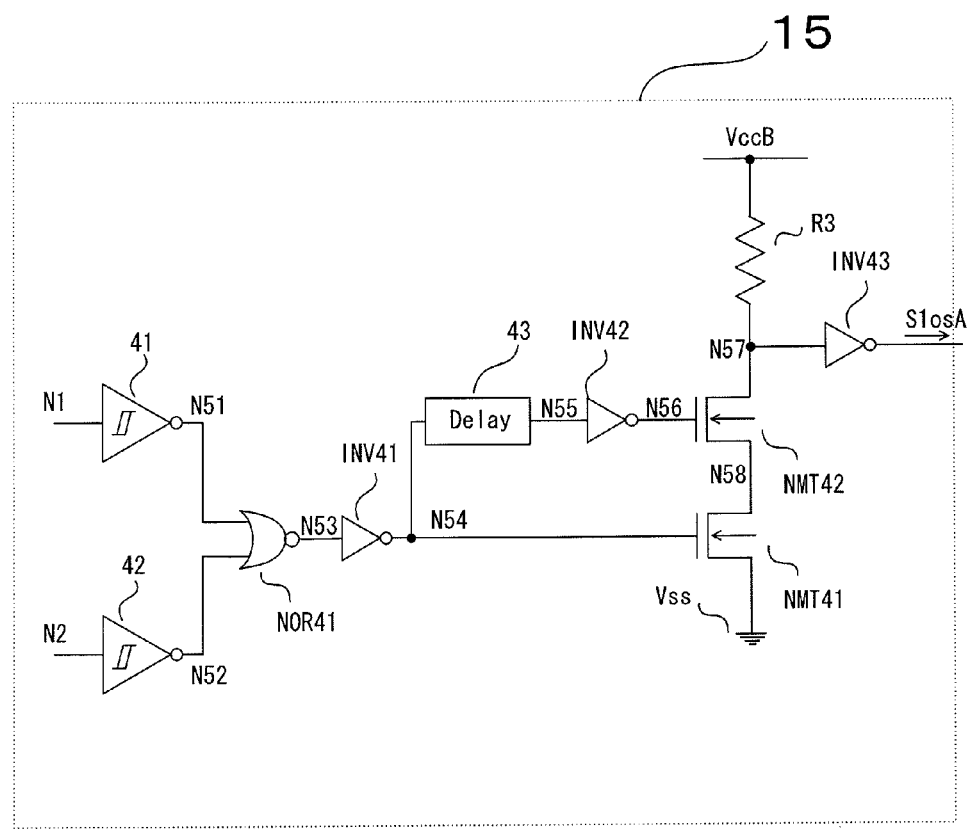
FIG. 18 is a circuit diagram showing a configuration of a one-shot pulse generation circuit according to the fifth embodiment.

A level shift switch according to a fifth embodiment will be described with reference to drawings. FIG. 17 is a circuit diagram showing a configuration of the level shift switch. FIG. 18 is a circuit diagram showing a configuration of a one-shot pulse generation circuit. In the embodiment, the level shift circuit includes the one-shot pulse generation circuit in order to accelerate a rising edge and a falling edge of an input signal.

Wherever possible, the same reference numerals or marks will be used to denote the same or like portions throughout the drawings, and the same description will not be repeated.

As shown in FIG. 17, a level shift switch 5 includes the one-shot pulse generation circuit 11, a one-shot pulse generation circuit 15, the transmission circuit 20, the Pch MOS transistor PMT1, the Pch MOS transistor PMT2, an Nch MOS transistor NMT2, an Nch MOS transistor NMT3, the terminal PadA, the terminal PadB, and the terminal Padoe.

The level shift switch 5 is of duplex type, and does not require a switching signal (DIR control signal).

The one-shot pulse generation circuit 15 is provided between the terminal PadA and the terminal PadB. The one-shot pulse generation circuit 15 has one end connected to the terminal PadA (the node N1) and the other end connected to the terminal PadB (the node N2). The one-shot pulse generation circuit 15 outputs a signal S1os1A.

The one-shot pulse generation circuit 11 accelerates makes a rising edge of an input signal. In contrast, the one-shot pulse generation circuit 15 accelerates a falling edge of the input signal.

The Nch MOS transistor NMT2 has the drain (one end) connected to the terminal PadA, the source (the other end) connected to the low voltage power supply Vss (ground potential), and the gate (control terminal) being input a signal S1osA (a one-shot pulse signal) from the one-shot pulse generation circuit 15. The Nch MOS transistor NMT3 has the drain (one end) connected to the terminal PadB, the source (the other end) connected to the low voltage power supply Vss (ground potential), and the gate (control terminal) being input a signal S1osA (a one-shot pulse signal) from the one-shot pulse generation circuit 15. The signal S1osA is a signal (a second one-shot pulse signal) in order to accelerate a falling edge of the input signal Sin1 and the input signal Sin2.

When the input signal Sin1 or the input signal Sin2 changes from the High level to the Low level (at the falling edge), the signal S1osA in an ENABLE condition (at the High level) has a one-shot pulse width. As a result, the Nch MOS transistor NMT2 and the Nch MOS transistor NMT3 are turned on during the one-shot pulse width in order to accelerate a falling edge of the signal.

As shown in FIG. 18, the one-shot pulse generation circuit 15 includes a Schmidt circuit 41, a Schmitt circuit 42, a delay circuit 43, a
2-input NOR circuit NOR41, inverters INV41 to 43, and an Nch MOS transistor NMT41, an Nch MOS transistor NMT42, and a resistance R3.

The Schmitt circuit 41 has an input side connected to the node N1, and the output side connected to the node N51. When the voltage of the node N2 changes from the High level to the Low level, the Schmitt circuit 41 outputs a signal changed from the Low level to the High level from the node N51.

The Schmitt circuit 42 has an input side connected to the node N2 and the output side connected to the node N52. When the voltage of the node N2 changes from the High level to the Low level, the Schmitt circuit 42 outputs a signal changed from the Low level to the High level from the node N52.

The 2-input NOR circuit 41 has a first input side is connected to the nodes N51, a second input side connected to the node N52, and the output side connected to the node N53. The 2-input NOR circuit 41 logically operates signals of the node N51 and the node N52 and outputs the logically operated signals from the node N53. The inverter INV41 inverts a signal of the node 53 and outputs the inverted signal from the node 54.

The delay circuit 43 has one end connected to the node N54 and the other end connected to the node N55. The delay circuit 43 delays a signal of the node N54 by a predetermined time and outputs the delayed signal from the node N55. The inverter INV42 has an input side connected to the node N55 and an output side connected to the node N56. The inverter INV42 inverts a signal of the node N55 and outputs the inverted signal from the node N56.

The resistance R3 has one end connected to the high voltage power supply VccB and the other end connected to the node N57. The Nch MOS transistor NMT41 has the drain (one end) connected to the node N58, the source (the other end) connected to the low voltage power supply Vss (ground potential), and the gate (control terminal) connected to the node N54. The Nch MOS transistor NMT41 has the drain (one end) connected to the node N57, the source (the other end) connected to the node N58, and the gate (control terminal) connected to the node N56. The inverter INV43 inverts a signal of the node N57 and outputs the signal S1osA (one-shot pulse signal) as the inverted signal.

The signal S1osA (one-shot pulse signal) has a one-shot pulse width, during which the voltages of the node N54 and the node N56 reach the High level, and the Nch MOS transistor NMT41 and the Nch MOS transistor NMT42 are turned off. The Time period of the one-shot pulse width is set to be the sum of a signal delay of the delay circuit 43 and a signal delay time of the inverter INV42.

As described above, the level shift switch of the embodiment includes the one-shot pulse generation circuit 11, the one-shot pulse generation circuit 15, the transmission circuit 20, the Pch MOS transistor PMT1, the Pch MOS transistor PMT2, the Nch MOS transistor NMT2, the Nch MOS transistor NMT3, and the terminal PadA, the terminal PadB, and the terminal Padoe. The one-shot pulse generation circuit 11 accelerates a rising edge of an input signal, and the one-shot pulse generation circuit 15 accelerates a falling edge of the input signal.

As a result, it is possible to speed up the signal transmission time of the level shift circuit 5 more than that of the first embodiment. The faster data transmission is achieved between the VccA system 2 and the VccB system 3.

The Nch MOS transistor NMT11 and the Nch MOS transistor NMT12 may be positionally replaced with each other in the first and fourth embodiments. The Nch MOS transistor NMT16 and the Nch MOS transistor NMT17 may be positionally replaced with each other in the third embodiment. The Nch MOS transistor NMT41 and the Nch MOS transistor NMT42 may be positionally replaced with each other in the fifth embodiment. It should be noted that the Nch MOS transistor NMT13, NMT14, and the Nch MOS transistor NMT15 may be also mutually replaced with each other.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A level shift switch, comprising:
a transmission circuit including a first transistor, the transmission circuit configured to transmit a signal between a first input-output terminal and a second input-output terminal, one end of the first transistor connected to the first input-output terminal, the other end of the first transistor connected to the second input-output terminal;
a second transistor having one end connected to a first power supply and the other end connected to the first input-output terminal;
a third transistor having one end connected to a second power supply and the other end connected to the second input-output terminal; and
a first one-shot pulse generation circuit including a fourth transistor and a fifth transistor, the first one-shot pulse generation circuit provided between the first input-output terminal and the second input-output terminal, the first one-shot pulse generation circuit configured to output a one-shot pulse signal to the second transistor and the third transistor, a first signal inputted into the fourth transistor not through a delay circuit but through the first input-output terminal, a second signal inputted into the fifth transistor, the second signal generated by delaying and inverting the first signal, the fifth transistor having one end to output a first one-shot pulse signal and the other end connected to the fourth transistor, wherein
the first signal is generated by logically operating signal levels of the first input-output terminal and the second input-output terminal, and is inputted into a control terminal of the fourth transistor.

2. The switch according to claim 1, wherein
the second signal is generated by a delay circuit and an inverter, the delay circuit and the inverter are in-series connected.

3. The switch according to claim 1, wherein
the one-shot pulse generation circuit has a first resistance, one end of the first resistance is connected to the second power supply, the other end of the first resistance is connected to one end of the fifth transistor.

4. The switch according to claim 1, wherein
the one-shot pulse generation circuit includes a first Schmitt circuit, a second Schmitt circuit and a first 2-input NAND circuit,
the first Schmitt circuit has an input side connected to the first input-output terminal,
the second Schmitt circuit has an input side connected to the second input-output terminal,
the first 2-input NAND circuit has a first input side connected to an output side of the first Schmitt circuit and a second input side connected to an output side of the second Schmitt circuit, the first 2-input NAND circuit outputs the first signal generated by logically operating.

5. The switch according to claim 1, wherein
a second resistance and a third resistance are provided to the transmission circuit, the second resistance has one end connected to the first power supply and the other end connected to the first input-output terminal, the third resistance has one end connected to the second power supply and the other end connected to the second input-output terminal.

6. The switch according to claim 5, wherein
the transmission circuit includes an OE control circuit to generate the control signal,
the OE control circuit generates a control signal, and outputs the control signal to a control terminal of the first transistor,
a signal voltage of the control signal is based on the first power supply.

7. The switch according to claim 1, wherein
the first transistor, the fourth transistor, and the fifth transistor are Nch MOSFETs.

8. The switch according to claim 1, wherein
the second transistor and the third transistor are Pch MOSFETs.

9. The switch according to claim 1, wherein
the one-shot pulse generation circuit includes a sixth transistor,
the fourth transistor has a control terminal connected to the first input-output terminal,
the sixth transistor has a control terminal connected to the second input-output terminal and one end connected to one end of the fourth transistor,
the second signal is generated by delaying and inverting a signal that is generated by logically operating signal levels of the first input-output terminal and the second input-output terminal.

10. The switch according to claim 9, wherein
the sixth transistor is an Nch MOSFET.

11. The switch according to claim 1, wherein
the first one-shot pulse generation circuit includes a first voltage detection circuit, a second voltage detection circuit, a first Pch MOSFET, and a first pull-up resistor,
the first voltage detection circuit is configured to detect a voltage of the first input-output terminal,
the second voltage detection circuit is configured to detect a voltage of the second input-output terminal,
the first Pch MOSFET has one end connected to the second power supply and the other end connected to the one end of the fifth transistor, a third signal inputted into a control terminal of the first Pch MOSFET, the third signal is generated by logically operating a detection voltage of the first voltage detection circuit and a detection voltage of the second voltage detection circuit,
the first pull-up resistor has one end connected to the second power supply and the other end connected to one end of the fifth transistor, and wherein
a fourth signal is generated by inverting and delaying the first signal, the second signal is generated by logically operating and inverting the fourth signal and the third signal.

12. The switch according to claim 11, wherein
the first one-shot pulse generation circuit includes a 2-input NAND circuit that is configured to generate the third signal.

13. The switch according to claim 1, wherein
the first one-shot pulse signal is to accelerate rising edges of the first input signal and the second input signal.

14. The switch according to claim 1, further comprising a seventh transistor, an eighth transistor, and a second one-shot pulse generation circuit,
the seventh transistor has one end connected to the first input-output terminal and the other end set to ground potential,
the eighth transistor has one end connected to the second input-output terminal and the other end set to ground potential,
the second one-shot pulse generation circuit is provided between the first input-output terminal and the second input-output terminal, the second one-shot pulse generation circuit is configured to output a second one-shot pulse signal to the seventh transistor and the eighth transistor, the second one-shot pulse signal is to accelerate falling edges of the first input signal and the second input signal.

15. The switch according to claim 14, wherein
the seventh transistor and the eighth transistor are Nch MOSFETs.

16. An electronic device comprising:
a first circuit configured to perform signal processing when the first circuit is supplied with a first power supply;
a second circuit configured to perform signal processing when the second circuit is supplied with a second power supply having a voltage equal to or higher than a first power supply voltage; and
a level shift switch having a first input-output terminal and a second input-output terminal, a first input signal generated in the first circuit inputted into the first input-output terminal, a first output signal outputted from the second input-output terminal to the second circuit, a second input signal generated in the second circuit inputted into the second input-output terminal, a second output signal outputted from the first input-output terminal to the first circuit,
the level shift switch including:
a transmission circuit including a first transistor, the transmission circuit configured to transmit a signal between the first input-output terminal and the second input-output terminal, the first transistor having one end connected to the first input-output terminal and the other end connected to the second input-output terminal;
a second transistor having one end connected to a first power supply and the other end connected to the first input-output terminal;
a third transistor having one end connected to a second power supply and the other end connected to the second input-output terminal; and
a first one-shot pulse generation circuit including a fourth transistor and a fifth transistor, the first one-shot pulse generation circuit provided between the first input-output terminal and the second input-output terminal, the first one-shot pulse generation circuit configured to output a one-shot pulse signal to the second transistor and the third transistor, a first signal inputted into the fourth transistor not through a delay circuit but through the first input-output terminal, a second signal inputted into the fifth transistor, the second signal generated by delaying and inverting the first signal, the fifth transistor having one end to output a first one-shot pulse signal and the other end connected to the fourth transistor, wherein
the level shift switch includes a seventh transistor, an eighth transistor, and a second one-shot pulse generation circuit, the seventh transistor has one end connected to the first input-output terminal and the other end connected to ground potential, the eighth transistor has one end connected to the second input-output terminal and the other end connected to the ground potential, the second one-shot pulse generation circuit is provided between the first input-output terminal and the second input-output terminal, the second one-shot pulse generation circuit outputs a second one-shot pulse signal to the seventh transistor and the eighth transistor, the second one-shot pulse signal is to accelerate falling edges of the first input signal and the second input signal.

17. The electric device according to claim 16, wherein the first one-shot pulse generation circuit accelerates rising edges of the first input signal and the second input signal.

* * * * *